United States Patent
Nahar et al.

(10) Patent No.: US 10,553,673 B2
(45) Date of Patent: Feb. 4, 2020

(54) METHODS USED IN FORMING AT LEAST A PORTION OF AT LEAST ONE CONDUCTIVE CAPACITOR ELECTRODE OF A CAPACITOR THAT COMPRISES A PAIR OF CONDUCTIVE CAPACITOR ELECTRODES HAVING A CAPACITOR INSULATOR THERE-BETWEEN AND METHODS OF FORMING A CAPACITOR

(71) Applicant: Micron Technology, Inc., Boise, ID (US)

(72) Inventors: Manuj Nahar, Boise, ID (US); Vassil N. Antonov, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/855,665

(22) Filed: Dec. 27, 2017

(65) Prior Publication Data

US 2019/0198606 A1      Jun. 27, 2019

(51) Int. Cl.
| | |
|---|---|
| *H01L 21/02* | (2006.01) |
| *C23C 16/02* | (2006.01) |
| *C23C 16/34* | (2006.01) |
| *C23C 16/40* | (2006.01) |
| *C23C 16/455* | (2006.01) |
| *H01L 27/108* | (2006.01) |
| *B82Y 99/00* | (2011.01) |
| *H01L 49/02* | (2006.01) |

(52) U.S. Cl.
CPC ........ *H01L 28/60* (2013.01); *H01L 21/02172* (2013.01); *H01L 21/02337* (2013.01); *H01L 21/02356* (2013.01); *H01L 21/0234* (2013.01); *H01L 28/75* (2013.01)

(58) Field of Classification Search
CPC ......... H01L 28/40; H01L 28/60; H01L 29/92; H01L 28/65
See application file for complete search history.

(56) References Cited

U.S. PATENT DOCUMENTS

| 7,709,359 B2 | 5/2010 | Boescke et al. |
| 8,304,823 B2 | 11/2012 | Boescke |

(Continued)

FOREIGN PATENT DOCUMENTS

| JP | 2006-041060 | 2/2006 |
| KR | 10-1999-0055163 | 7/1999 |

(Continued)

OTHER PUBLICATIONS

U.S. Appl. No. 15/591,541, filed Aug. 30, 2017, by Nahar et al.

*Primary Examiner* — Brian Turner
(74) *Attorney, Agent, or Firm* — Wells St. John P.S.

(57) ABSTRACT

A method used in forming at least a portion of at least one conductive capacitor electrode of a capacitor that comprises a pair of conductive capacitor electrodes having a capacitor insulator there-between comprises forming an insulative first material comprising an amorphous insulative metal oxide. The amorphous insulative metal oxide is reduced in a reducing-ambient to form a conductive second material from the insulative first material. Such reducing in the reducing-ambient both (a) removes oxygen from and changes the stoichiometry of the metal oxide, and (b) crystallizes the metal oxide into a crystalline state that is conductive.

31 Claims, 6 Drawing Sheets

(56) References Cited

U.S. PATENT DOCUMENTS

| | | | |
|---|---|---|---|
| 9,147,689 B1 | 9/2015 | Chavan et al. | |
| 9,437,420 B2 | 9/2016 | Cho et al. | |
| 2002/0022334 A1* | 2/2002 | Yang | H01L 28/56 438/396 |
| 2002/0031919 A1 | 3/2002 | Basceri | |
| 2004/0033183 A1 | 2/2004 | Fife | |
| 2006/0017090 A1 | 1/2006 | Fukumaki et al. | |
| 2007/0264838 A1* | 11/2007 | Krishnan | H01L 27/10852 438/758 |
| 2009/0311498 A1* | 12/2009 | Kiyomura | C23C 16/0272 428/218 |
| 2010/0007016 A1* | 1/2010 | Oppermann | H01L 21/486 257/737 |
| 2011/0204475 A1* | 8/2011 | Rui | C01G 23/047 257/532 |
| 2012/0262835 A1* | 10/2012 | Ramani | H01L 28/60 361/271 |
| 2012/0309162 A1* | 12/2012 | Chen | |
| 2013/0109147 A1* | 5/2013 | Rocklein | H01L 45/08 438/381 |
| 2013/0155572 A1* | 6/2013 | Popovici | H01L 28/56 361/305 |
| 2014/0256128 A1* | 9/2014 | Spurlin | H01L 21/76861 438/643 |
| 2015/0102460 A1* | 4/2015 | Rocklein | H01L 28/40 257/532 |
| 2015/0140773 A1* | 5/2015 | Antonov | H01G 4/306 438/381 |
| 2015/0357399 A1 | 12/2015 | Cho et al. | |
| 2016/0093625 A1* | 3/2016 | Rui | H01L 28/75 257/532 |
| 2016/0099304 A1* | 4/2016 | Mathur | H01L 28/75 257/532 |
| 2016/0168699 A1* | 6/2016 | Fukazawa | C23C 16/4402 427/576 |
| 2017/0162587 A1 | 6/2017 | Chavan et al. | |

FOREIGN PATENT DOCUMENTS

| | | |
|---|---|---|
| KR | 10-2015-0140034 | 12/2015 |
| WO | WO PCT/US2018/065450 | 4/2019 |

* cited by examiner

METHODS USED IN FORMING AT LEAST A PORTION OF AT LEAST ONE CONDUCTIVE CAPACITOR ELECTRODE OF A CAPACITOR THAT COMPRISES A PAIR OF CONDUCTIVE CAPACITOR ELECTRODES HAVING A CAPACITOR INSULATOR THERE-BETWEEN AND METHODS OF FORMING A CAPACITOR

TECHNICAL FIELD

Embodiments disclosed herein pertain to methods of forming capacitors and components of capacitors.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field will be volatile or non-volatile. For example, a capacitor insulating material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and to read (i.e., determine) a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the hi-stable characteristics of the ferroelectric material that forms a part of the capacitor.

Capacitors may be used in circuitry other than memory circuitry.

DETAILED DESCRIPTION OF EXAMPLE EMBODIMENTS

Embodiments of the invention encompass methods used in forming at least a portion of at least one conductive capacitor electrode of a capacitor that comprises a pair of conductive capacitor electrodes having a capacitor insulator there-between, and encompass methods of forming a capacitor. First example embodiments of a method of forming a capacitor are described with reference to FIGS. 1-4.

Figure 1:
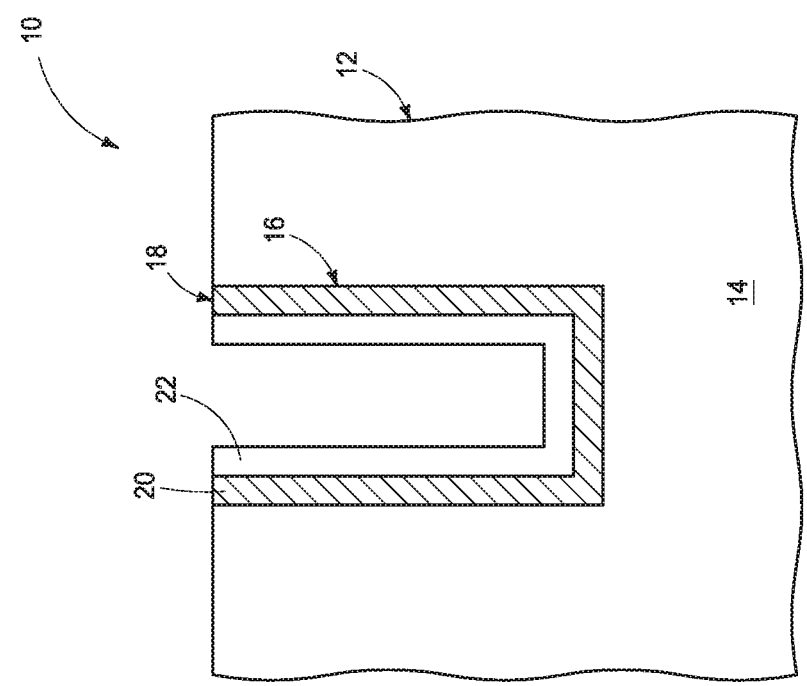
FIG. 1 is a diagrammatic cross-sectional view of a portion of a substrate construction in process in accordance with an embodiment of the invention.

Referring to FIG. 1, an example substrate or construction 10 comprises a base substrate 12, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Materials may be aside, below, and/or above the FIG. 1—depicted materials. For example, other partially or wholly fabricated components of integrated circuitry may be provided somewhere about or within construction 10. Substrate 12 may comprise any one or more of conductive/conductor/conducting (i.e., electrically herein), semiconductive/semiconductor/semiconducting, or insulative/insulator/insulating (i.e., electrically herein) materials. In this document, a conductive/conductor/conducting material has compositional intrinsic electrical conductivity of at least $3\times10^4$ Siemens/cm (i.e., at 20° C. everywhere herein) as opposed to electrical conductivity that could occur by movement of positive or negative charges through a thin material that is otherwise intrinsically insulative. In this document, an insulative/insulator/insulating material has compositional intrinsic electrical conductivity of no greater than $1\times10^{-9}$ Siemens/cm (i.e., it is electrically resistive as opposed to being conductive or semiconductive).

Example substrate 12 is shown as comprising insulative material 14 (e.g., silicon dioxide and/or silicon nitride) within which an opening 16 has been formed. The discussion proceeds relative to fabrication of an example single capacitor, although many more may be fabricated including, for example, an array of capacitors of memory or other circuitry. Control and/or other peripheral circuitry for operating components within an array of capacitors may also be fabricated, and may or may not be wholly or partially within a capacitor array or sub-array. Further, multiple sub-arrays may also be fabricated and operated independently, in tandem, or otherwise relative one another.

A first conductive capacitor electrode 18 has been formed within opening 16. Such may comprise, consist essentially of, or consist of any suitable conductive material 20, for example metal material and/or conductively-doped semiconductive material. In one embodiment and as shown, capacitor electrode has an upwardly-open container shape. However, any other existing or future developed capacitor electrode shapes and/or final capacitor shapes may be used. A capacitor insulator 22 has been formed over first conductive capacitor electrode 18. Any suitable insulator material may be used, and which may be programmable or may not be programmable. Accordingly, such may be ferroelectric, antiferroelectric, a linear dielectric, a non-linear dielectric, a high-k dielectric, etc.

Figure 2:
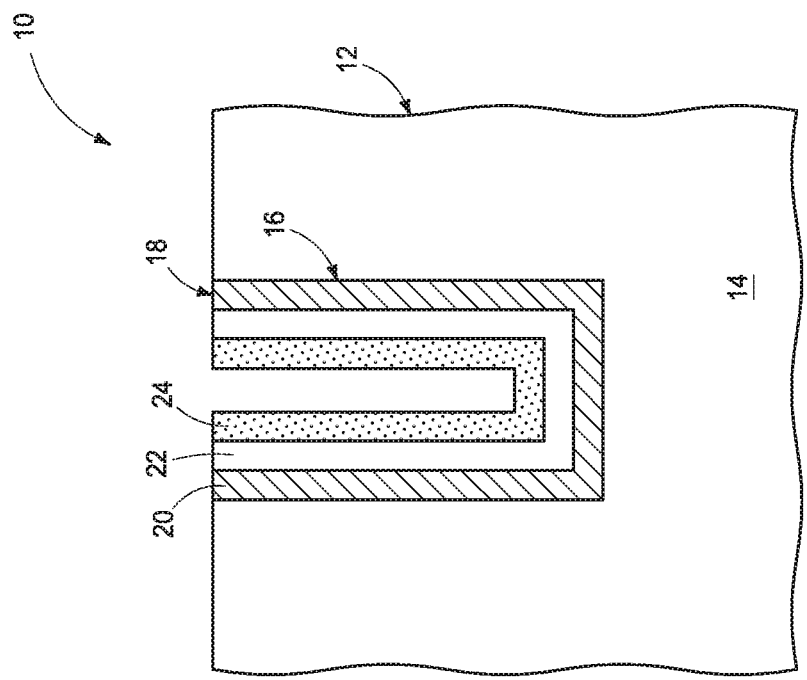
FIG. 2 is a view of the FIG. 1 construction at a processing step subsequent to that shown by FIG. 1.

A second conductive capacitor electrode is formed over capacitor insulator 22, for example as described below with reference to FIGS. 2-4. Referring to FIG. 2, an insulative first material 24 comprising, consisting essentially of, or consisting of an amorphous insulative metal oxide has been formed over capacitor insulator 22. In the context of this document, a material or state that is "amorphous" is at least 90% by volume amorphous. Any existing or future developed amorphous insulative metal oxides may be used, with some specific ideal examples being provide below (and which may be used in combinations of any two or more of such examples). A construction such as shown in FIG. 1 comprising first conductive capacitor electrode 18 and capacitor insulator 22 may be formed by depositing layers of such materials atop insulative material 14 and within opening 16 to the example depicted thicknesses, followed by planarizing materials 22 and 20 back at least to the elevationally-outermost surface of insulative material 14. Alternately, by way of example, a construction such as shown in FIG. 2 may be formed by depositing layers of the depicted materials atop insulative material 14 and within opening 16 to the example depicted thicknesses, followed by planarizing such materials back at least to the elevationally-outermost surface of insulative material 14.

Figure 3:
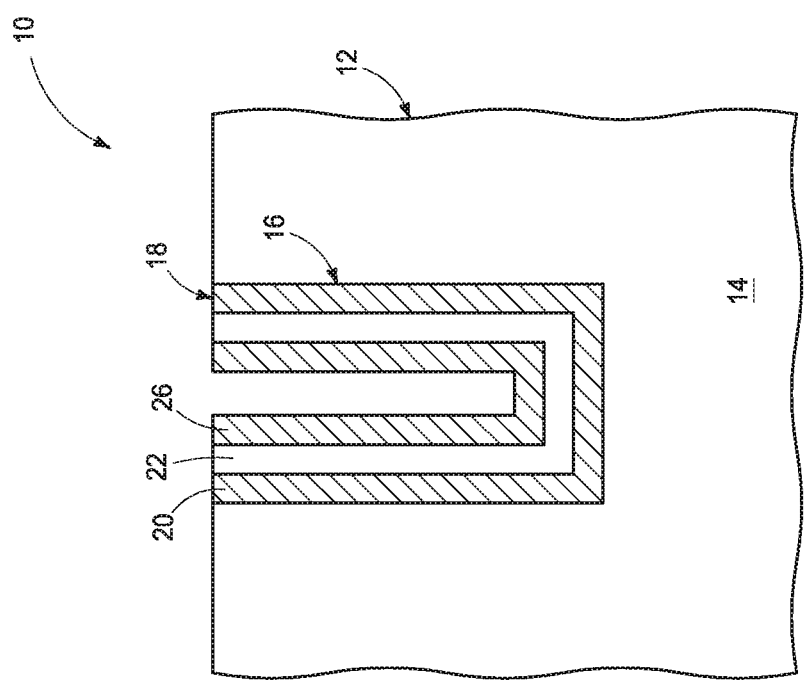
FIG. 3 is a view of the FIG. 2 construction at a processing step subsequent to that shown by FIG. 2.

Referring to FIG. 3, amorphous insulative metal oxide 24 (not shown) has been reduced (i.e., chemically) in a reducing-ambient to form a conductive second material 26 from insulative first material 24 of FIG. 2. Such act of reducing in the reducing-ambient both: (a) removes oxygen from and changes the stoichiometry of the metal oxide, and (b) crystalizes the metal oxide into a crystalline state that is conductive. In the context of this document, a material or state that is "crystalline" is at least 90% by volume crystalline. Different composition amorphous insulative metal oxides may form one or more different crystalline lattice(s) and/or be polycrystalline. Regardless, such act of reducing may be conducted before or after (if ever) planarizing amorphous insulative metal oxide material 24 back at least to the elevationally-outermost surface of insulative material 14.

In one embodiment, conductivity of conductive crystalline metal oxide 26 is no greater than $7.0\times10^5$ Siemens/cm. In one embodiment, the reducing-ambient comprises plasma (including remote plasma), and in another embodiment does not comprise plasma. Regardless, in one embodiment the reducing-ambient comprises temperature of at least 100° C. and comprises pressure of 1 Torr or less. By of way examples only, if using plasma, a substrate temperature within the reducing-ambient is 100° C. to 900° C. An example pressure of the reducing-ambient is 1 mTorr to 1 Torr, and an example exposure-time to the reducing-ambient is from 1 second to 48 hours. Example non-plasma conditions include the same exposure time to the reducing-ambient, a substrate temperature of 300° C. to 900° C., and a pressure of 1 mTorr to 10 Atmospheres.

In one embodiment, the reducing-ambient comprises at least one of (a) molecular and/or ionized $H_2$, (b) nitrogen ions, (c) molecular and/or ionized $NH_3$, (d) molecular and/or ionized $N_2H_2$, and (e) a molecular and/or ionized alkane (e.g., such as at least one of methane, ethane, propane and butane). Any suitable flow rate(s) of gas, for example, from which the reducing ambient is derived may be used.

In one embodiment, the reducing-ambient comprises a non-metal element (i.e., an element that is neither a metal element nor a semimetal element) which becomes a component of the conductive crystalline metal oxide during the act of reducing. In one such embodiment, the non-metal element is at least nitrogen, and in one such embodiment the reducing-ambient comprises at least one of (a) nitrogen ions, (b) molecular and/or ionized $NH_3$, and (c) molecular and/or ionized $N_2H_2$.

In one embodiment, the amorphous insulative metal oxide comprises, consists essentially of, or consists of $Nb_2O_5$ and the conductive crystalline metal oxide comprises, consists essentially of, or consists of at least one of (a) $NbO_x$, where $0<x<1.5$, and (b) $NbO_yN_z$ where $0<y+z<2.0$ and $0<y<1.5$. In one embodiment, the amorphous insulative metal oxide comprises, consists essentially of, or consists of $Ta_2O_5$ and the conductive crystalline metal oxide comprises, consists essentially of, or consists of at least one of (a) $TaO_x$, where $0<x<1.5$, and (b) $TaO_yN_z$ where $0<y+z<2.0$ and $0<y<1.5$. In one embodiment, the amorphous insulative metal oxide comprises, consists essentially of, or consists of $TiO_2$ and the conductive crystalline metal oxide comprises, consists essentially of, or consists of at least one of (a) $TiO_x$, where $0<x<1.5$, and (b) $TiO_yN_z$ where $0<y+z<2.0$ and $0<y<1.5$. In one embodiment, the amorphous insulative metal oxide comprises, consists essentially of, or consists of $VO_2$ and the conductive crystalline metal oxide comprises, consists essentially of, or consists of at least one of (a) $VO_x$, where $0<x<1.5$, and (b) $VO_yN_z$ where $0<y+z<2.0$ and $0<y<1.5$. In one embodiment, the amorphous insulative metal oxide comprises, consists essentially of, or consists of $MoO_3$ and the conductive crystalline metal oxide comprises, consists essentially of, or consists of at least one of (a) $MoO_x$, where $0<x<2.5$, and (b) $MoO_yN_z$ where $0<y+z<3.0$ and $0<y<2.0$. In one embodiment, the amorphous insulative metal oxide comprises, consists essentially of, or consists of $WO_3$ and the conductive crystalline metal oxide comprises, consists essentially of, or consists of at least one of (a) $WO_x$, where $0<x<2.5$, and (b) $WO_yN_z$ where $0<y+z<3.0$ and $0<y<2.0$. In one embodiment, the amorphous insulative metal oxide comprises, consists essentially of, or consists of $CrO_4$ and the conductive crystalline metal oxide comprises, consists essentially of, or consists of at least one of (a) $CrO_x$, where $0<x<3.0$, and (b) $CrO_yN_z$ where $0<y+z<4.0$ and $0<y<3.0$.

Figure 4:
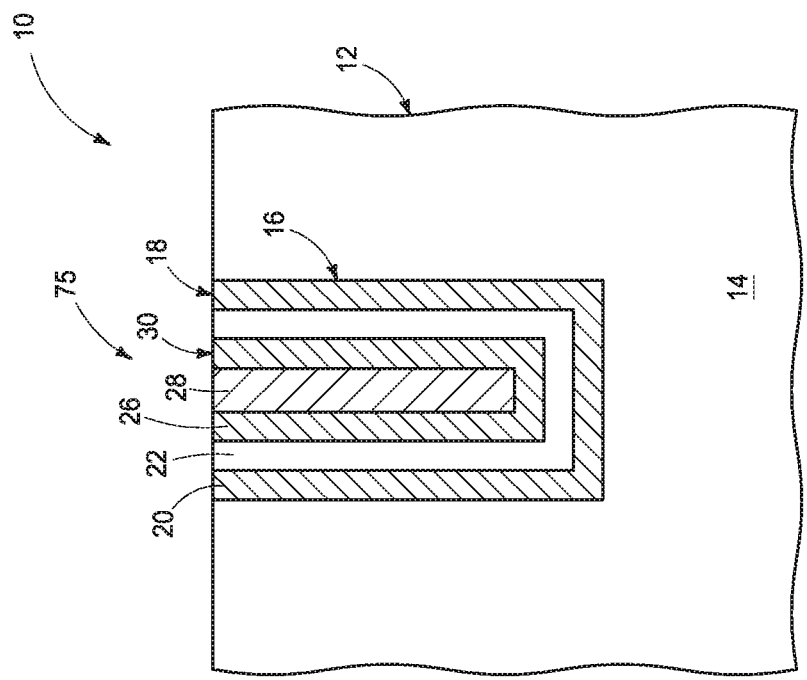
FIG. 4 is a view of the FIG. 3 construction at a processing s p subsequent to that shown by FIG. 3.

FIG. 4 shows deposition of another conductive material 28 which may be of the same composition as or of different composition from that of conductive crystalline metal oxide 26, thus for example completing formation of an example second conductive capacitor electrode 30 and an example capacitor 75. When conductive second material 26 is formed, such may be formed in situ in a same chamber within which the act of reducing is conducted. Regardless, conductive material 28 may comprise multiple layers (not shown), and for example comprise a conductive metal nitride and/or conductive metal oxynitride. Example materials 20 and 28 comprise one or more of TiN, TiAlN, AlN, W, WSix, and conductive metal oxynitrides. In but one example, material 26 may comprise $NbO_yN_z$ where $0<y+z<2.0$ and $0<y<1.5$, and material 28 may be TiN whereby an interface of materials 26 and 28 forms a conductive bilayer comprising NbON/TiON (e.g., two conductive oxynitrides). Example respective thickness for each of materials 20, 22, 24, and 26 is 15 Angstroms to 500 Angstroms.

Any other attribute(s) or aspect(s) as shown and/or described herein with respect to other embodiments may be used in the embodiments of FIGS. 1-4.

Figure 5:
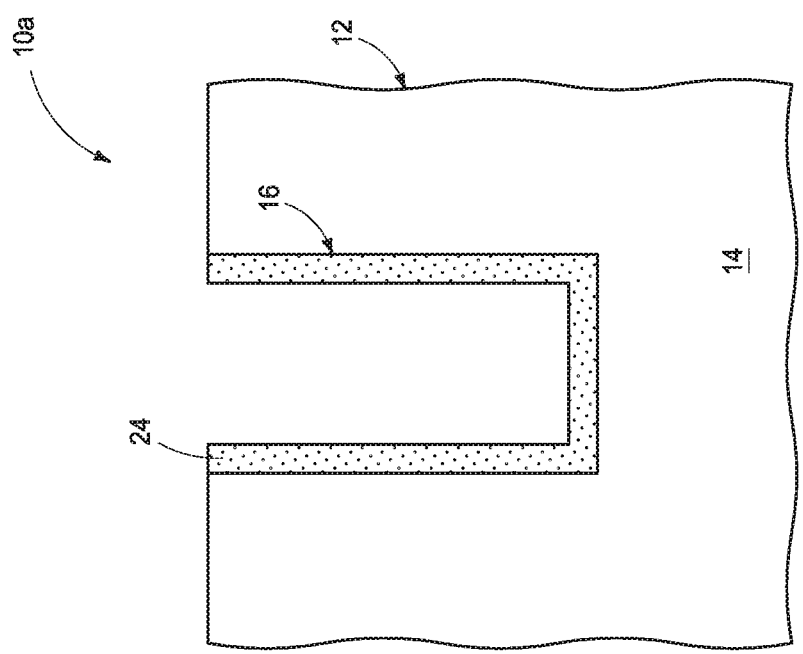
FIG. 5 is a diagrammatic cross-sectional view of a portion of a substrate construction in process in accordance with an embodiment of the invention.

Another example embodiment of a method of forming a capacitor is next described with reference to FIGS. 5-8 with respect to a construction 10a. Like numerals from the above-described embodiments have been used where appropriate for like materials and predecessor constructions, with some differences being indicated with the suffix "a" or with different numerals. Referring to FIG. 5, insulative first material 24 comprising an amorphous insulative metal oxide has been formed within opening 16.

Figure 6:
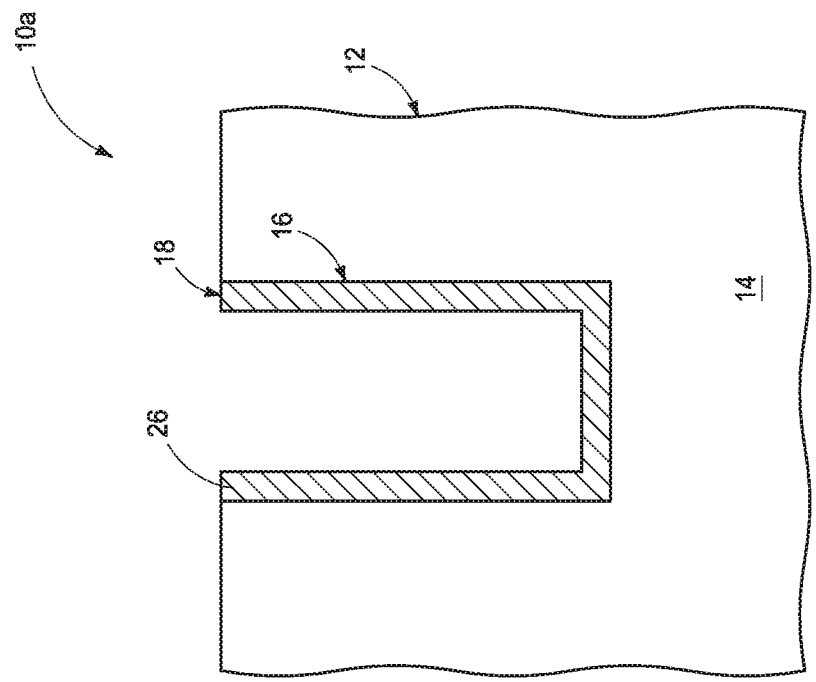
FIG. 6 is a view of the FIG. 5 construction at a processing step subsequent to that shown by FIG. 5.

Referring to FIG. 6, amorphous insulative metal oxide material 24 (not shown) of FIG. 5 has been reduced in a reducing-ambient to form conductive second material 26 comprising an upwardly-open container shape (in one embodiment) from insulative first material 24. Again, such act of reducing is conducted in a reducing-ambient that both (a) removes oxygen from and changes the stoichiometry of the metal oxide, and (b) crystallizes the metal oxide into a crystalline state that is conductive. Example first conductive capacitor electrode 18 has thereby been formed.

Figure 7:
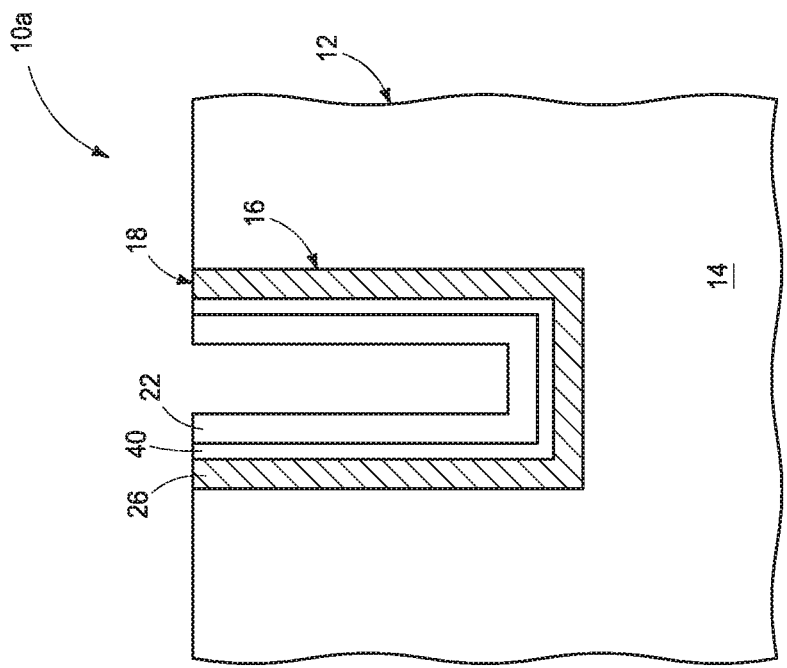
FIG. 7 is a view of the FIG. 6 construction at a processing step subsequent to that shown by FIG. 6.

Referring to FIG. 7, an oxidation-barrier material 40 comprising an upwardly-open container shape (in one embodiment) has been optionally formed within and directly against container-shaped first conductive capacitor electrode 18. In one embodiment, oxidation-barrier material 40 is exposed to oxidizing conditions, with oxidation-barrier material 40 during such exposure restricting oxidation of conductive crystalline metal oxide 26. In one such embodiment, oxidation-barrier material 40 precludes any measurable oxidation of conductive crystalline metal oxide 26 during such exposure to oxidizing conditions.

Figure 8:
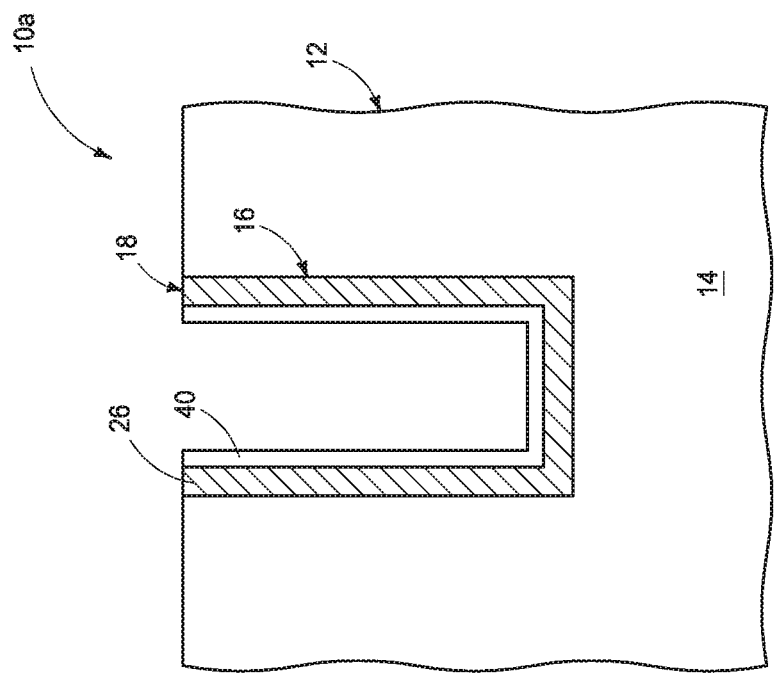
FIG. 8 is a view of the FIG. 7 construction at a processing step subsequent to that shown by FIG. 7.

Referring to FIG. 8, capacitor insulator 22 has been formed directly against oxidation-barrier material 40. In one embodiment, oxidation-barrier material 40 is insulative (e.g., $Al_2O_3$, $Si_3N_4$, $SiO_2$, etc.) and in one embodiment is part of the capacitor insulator (e.g., forming a composite capacitor insulator 40/22). In such embodiment, material 40 may be of the same composition as or of different composition from capacitor insulator 22, and in one embodiment the forming of capacitor insulator 40/22 comprises or includes forming of oxidation-barrier material 40. In one embodiment, capacitor insulator 22 is formed to comprise oxygen and further comprises exposing oxidation-barrier material 40 to oxidizing conditions that includes exposure to oxygen, with oxidation-barrier material 40 during such exposing restricting oxidation of conductive crystalline metal oxide 26, and with capacitor insulator 22 being formed directly against oxidation-barrier material 40.

Figure 9:
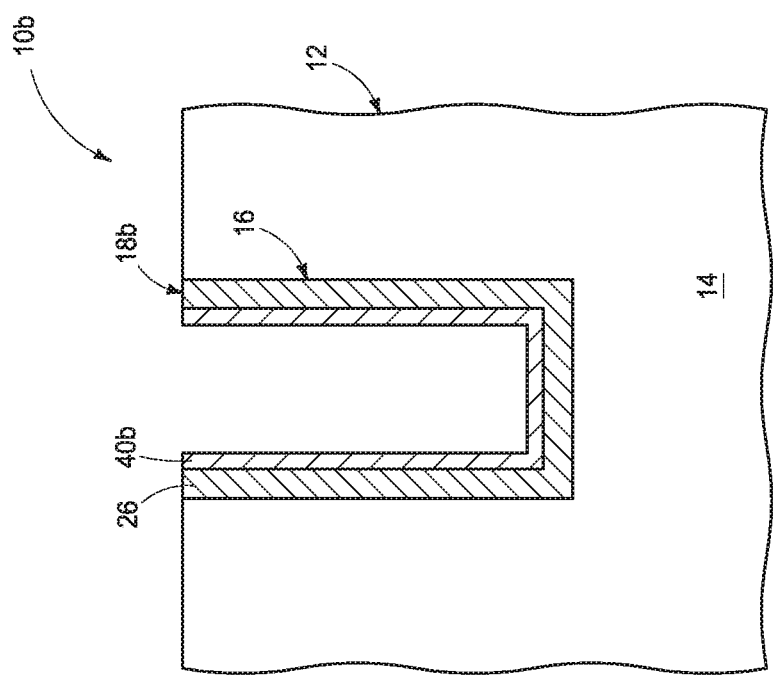
FIG. 9 is a view of the FIG. 8 construction at a processing step subsequent to that shown by FIG. 8.

FIG. 9 shows example subsequent processing whereby conductive material 28 has been formed to comprise second conductive capacitor electrode 30 over capacitor insulator 40/22 and a capacitor 75a.

Any other attribute(s) or aspect(s) as shown and/or described herein with respect to other embodiments may be used.

Figure 10:
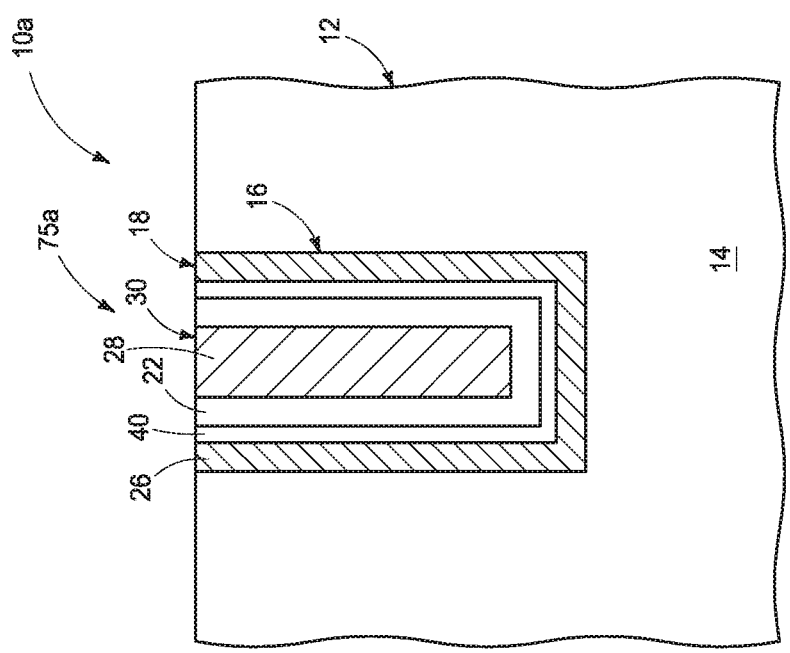
FIG. 10 is a diagrammatic cross-sectional view of a portion of a substrate construction in process in accordance with an embodiment of the invention.
Figure 12:
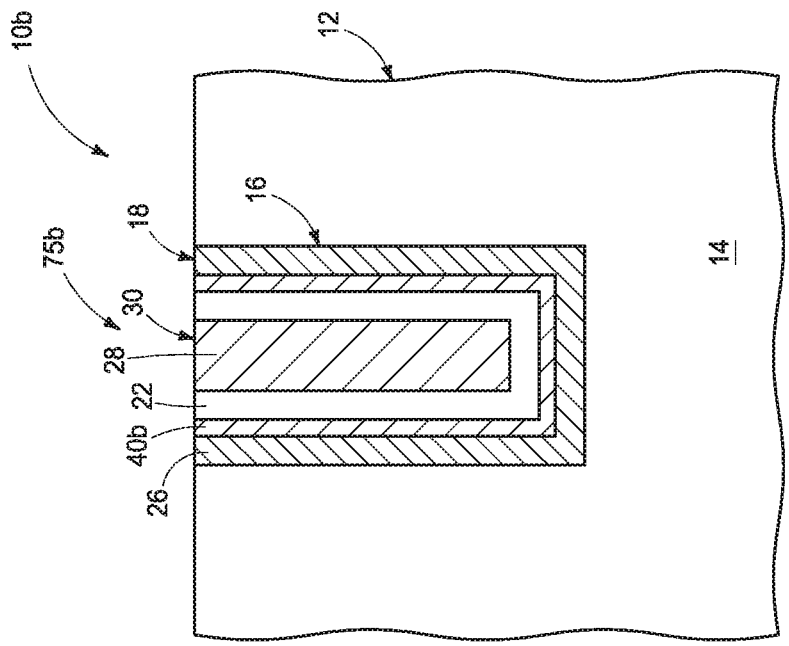
FIG. 12 is a view of the FIG. 11 construction at a processing step subsequent to that shown by FIG. 11.
Figure 11:
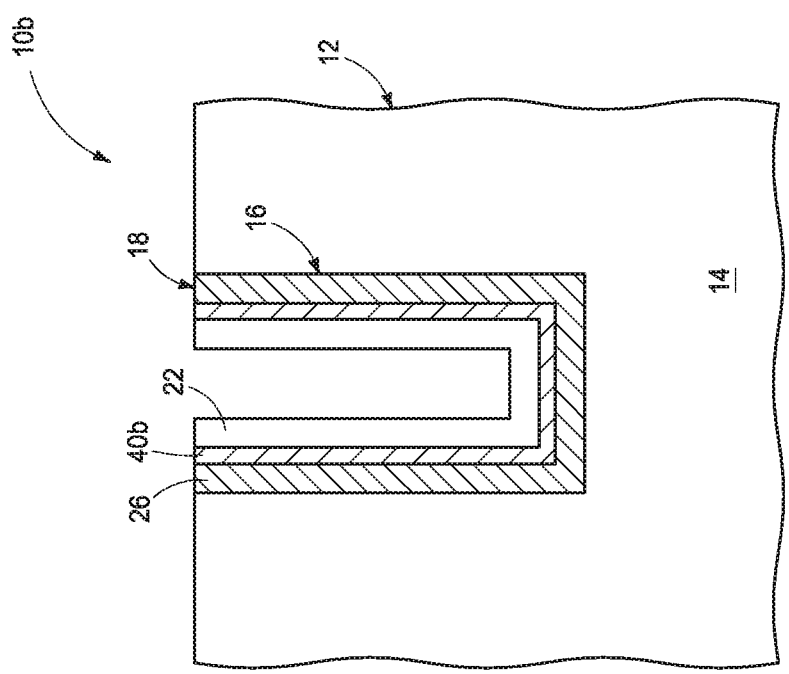
FIG. 11 is a view of the FIG. 10 construction at a processing step subsequent to that shown by FIG. 10.

FIGS. 10-12 show formation of an alternate example embodiment capacitor 75b (FIG. 12) to those described above with respect, to FIGS. 5-9. Like numerals from the above-described embodiments have been used where appropriate, with some differences being indicated with suffix "b". FIGS. 10-12 show analogous processing to that described above with respect to FIGS. 7-9, respectively, but wherein oxidation-barrier material 40b is conductive (e.g., it is shown with hatching), and thereby forms part of first conductive capacitor electrode 18b. By way of examples only, example conductive materials 40b include any one or more TiN, AlN, $Ti_xAl_yN_z$, $Ti_xO_yN_z$, and Pt. Example thickness for oxidation-barrier material 40, 40b is from 0 to 50 Angstroms. Any other attribute(s) or aspect(s) as shown and/or described herein with respect to other embodiments may be used.

In one embodiment, a method used in forming at least a portion of at least one conductive capacitor electrode (e.g., 18, 20, and regardless of its shape) of a capacitor (e.g., 75, 75a, 75b) that comprises a pair of conductive capacitor electrodes having a capacitor insulator (e.g., 22, 40/22) there-between comprises forming an insulative first material (e.g., 24) comprising an amorphous insulative metal oxide. The amorphous insulative metal oxide is reduced in a reducing-ambient to form a conductive second material (e.g., 26) from the insulative first material. Such reducing in the reducing-ambient both (a) removes oxygen from and changes the stoichiometry of the metal oxide, and (b) crystallizes the metal oxide into a crystalline state that is conductive.

In some embodiments, any two or all three of the three embodiments of FIGS. 1-4, FIGS. 5-9, and FIGS. 10-12 are combined.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further. "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or future developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a method used in forming at least a portion of at least one conductive capacitor electrode of a capacitor that comprises a pair of conductive capacitor electrodes having a capacitor insulator there-between comprises forming an insulative first material comprising an amorphous insulative metal oxide. The amorphous insulative metal oxide is reduced in a reducing-ambient to form a conductive second material from the insulative first material. Such reducing in the reducing-ambient both (a) removes oxygen from and changes the stoichiometry of the metal oxide, and (b) crystallizes the metal oxide into a crystalline state that is conductive.

In some embodiments, a method of forming a capacitor that comprises a pair of conductive capacitor electrodes having a capacitor insulator there-between comprises forming a first conductive capacitor electrode. A capacitor insulator is formed over the first conductive capacitor electrode. A second conductive capacitor electrode is formed over the capacitor insulator and comprises forming an insulative first material comprising an amorphous insulative metal oxide. The amorphous insulative metal oxide is reduced in a reducing-ambient to form a conductive second material from the insulative first material. Such reducing in the reducing-ambient both (a) removes oxygen from and changes the stoichiometry of the metal oxide, and (b) crystallizes the metal oxide into a crystalline state that is conductive.

In some embodiments, a method of forming a capacitor that comprises a pair of conductive capacitor electrodes having a capacitor insulator there-between comprises forming a first conductive capacitor electrode comprising forming an insulative first material comprising an amorphous insulative metal oxide. The amorphous insulative metal oxide is reduced in a reducing-ambient to form a conductive second material from the insulative first material. Such reducing in the reducing-ambient both (a) removes oxygen from and changes the stoichiometry of the metal oxide, and (h) crystallizes the metal oxide into a crystalline state that is conductive. A capacitor insulator is formed over the first conductive capacitor electrode. A second conductive capacitor electrode is formed over the capacitor insulator.

In some embodiments, a method of forming a capacitor that comprises a pair of conductive capacitor electrodes having a capacitor insulator there-between comprises forming a first conductive capacitor electrode comprising forming an insulative first material comprising an upwardly-open container shape. The insulative first material comprises an amorphous insulative metal oxide. The amorphous insulative metal oxide is reduced in a reducing-ambient to form a conductive second material comprising an upwardly-open container shape from the insulative first material. Such reducing in the reducing-ambient both (a) removes oxygen from and changes the stoichiometry of the metal oxide, and (b) crystallizes the metal oxide into a crystalline state that is conductive. An oxidation-barrier material comprising an upwardly-open container shape is formed within and directly against the container-shaped first conductive capacitor electrode. The oxidation-barrier material is exposed to oxidizing conditions. The oxidation-barrier material during said exposing restricts oxidation of the conductive crystalline metal oxide. A capacitor insulator is formed directly against the oxidation-barrier material. A second conductive capacitor electrode is formed directly against the capacitor insulator.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming at least a portion of at least one conductive capacitor electrode of a capacitor that comprises a pair of conductive capacitor electrodes having a capacitor insulator there-between, comprising:
    forming an insulative first material consisting of an amorphous insulative metal oxide, the metal of the metal oxide comprising one or more members of the group consisting of Nb, Ta, Ti, V, W and Cr; and
    reducing the amorphous insulative metal oxide in a reducing-ambient to form a conductive second material from the insulative first material, said reducing in the reducing-ambient both:
        (a) removing oxygen from and changing the stoichiometry of the metal oxide; and
        (b) crystallizing the metal oxide into a crystalline state that is conductive.

2. The method of claim 1 wherein the reducing-ambient comprises plasma.

3. The method of claim 1 wherein the reducing-ambient does not comprise plasma.

4. The method of claim 1 wherein the reducing-ambient comprises temperature of at least 100° C. and comprises pressure of 1 Torr or less.

5. The method of claim 1 wherein the reducing-ambient comprises at least one of (a) molecular and/or ionized $H_2$, (b) nitrogen ions, (c) molecular and/or ionized $NH_3$, (d) molecular and/or ionized $N_2H_2$, and (e) a molecular and/or ionized alkane.

6. The method of claim 5 wherein the reducing-ambient comprises at least one of the (a) molecular and/or ionized $H_2$ and the (e) a molecular and/or ionized alkane.

7. The method of claim 6 wherein the reducing-ambient comprises (a) molecular and/or ionized $H_2$.

8. The method of claim 6 wherein the reducing-ambient comprises (e) a molecular and/or ionized alkane.

9. The method of claim 6 wherein the molecular and/or ionized alkane is at least one of methane, ethane, propane, and butane.

10. The method of claim 1 wherein the reducing-ambient comprises a non-metal element which becomes a component of the conductive crystalline metal oxide during said reducing.

11. The method of claim 10 wherein the non-metal element is at least nitrogen.

12. The method of claim 11 wherein the reducing-ambient comprises at least one of (a) nitrogen ions, (b) molecular and/or ionized $NH_3$, and (c) molecular and/or ionized $N_2H_2$.

13. The method of claim 1 wherein the amorphous insulative metal oxide comprises $Nb_2O_5$ and the conductive crystalline metal oxide comprises at least one of (a) $NbO_x$, where $0<x<1.5$, and (b) $NbO_yN_z$ where $0<y+z<2.0$ and $0<y<1.5$.

14. The method of claim 1 wherein the amorphous insulative metal oxide comprises $Ta_2O_5$ and the conductive crystalline metal oxide comprises at least one of (a) $TaO_x$, where $0<x<1.5$, and (b) $TaO_yN_z$ where $0<y+z<2.0$ and $0<y<1.5$.

15. The method of claim 1 wherein the amorphous insulative metal oxide comprises $TiO_2$ and the conductive crystalline metal oxide comprises at least one of (a) $TiO_x$, where $0<x<1.5$, and (b) $TiO_yN_z$ where $0<y+z<2.0$ and $0<y<1.5$.

16. The method of claim 1 wherein the amorphous insulative metal oxide comprises $VO_2$ and the conductive crystalline metal oxide comprises at least one of (a) $VO_x$, where $0<x<1.5$, and (b) $VO_yN_z$ where $0<y+z<2.0$ and $0<y<1.5$.

17. The method of claim 1 wherein the amorphous insulative metal oxide comprises $WO_3$ and the conductive crystalline metal oxide comprises at least one of (a) $WO_x$, where $0<x<2.5$, and (b) $WO_yN_z$ where $0<<3M$ and $0<y<2.0$.

18. The method of claim 1 wherein the amorphous insulative metal oxide comprises $CrO_4$ and the conductive crystalline metal oxide comprises at least one of (a) $CrO_x$, where $0<x<3.0$, and (b) $CrO_yN_z$ where $0<y+z<4.0$ and $0<y<3.0$.

19. The method of claim 1 wherein conductivity of the conductive crystalline metal oxide is no greater than $7.0 \times 10^5$ Siemens/cm.

20. The method of claim 1 comprising providing a capacitor insulator directly against the crystallized metal oxide.

21. A method of forming a capacitor that comprises a pair of conductive capacitor electrodes having a capacitor insulator there-between, comprising:
    forming a first conductive capacitor electrode;
    forming a capacitor insulator over the first conductive capacitor electrode; and
    forming a second conductive capacitor electrode over the capacitor insulator, comprising:
        forming an insulative first material consisting of an amorphous insulative metal oxide, the metal of the metal oxide comprising one or more members of the group consisting of Nb, Ta, Ti, V, W and Cr; and
        reducing the amorphous insulative metal oxide in a reducing-ambient to form a conductive second material from the insulative first material, said reducing in the reducing-ambient both:
            (a) removing oxygen from and changing the stoichiometry of the metal oxide; and
            (b) crystallizing the metal oxide into a crystalline state that is conductive.

22. A method of forming a capacitor that comprises a pair of conductive capacitor electrodes having a capacitor insulator there-between, comprising:
    forming a first conductive capacitor electrode, comprising:
        forming an insulative first material consisting of an amorphous insulative metal oxide, the metal of the metal oxide comprising one or more members of the group consisting of Nb, Ta, Ti, V, W and Cr; and
        reducing the amorphous insulative metal oxide in a reducing-ambient to form a conductive second material from the insulative first material, said reducing in the reducing-ambient both:
            (a) removing oxygen from and changing the stoichiometry of the metal oxide; and (b) crystallizing the metal oxide into a crystalline state that is conductive;
forming a capacitor insulator over the first conductive capacitor electrode; and
forming a second conductive capacitor electrode over the capacitor insulator.

23. The method of claim 22 comprising forming an oxidation-barrier material directly against the first conductive capacitor electrode.

24. The method of claim 23 wherein the oxidation-barrier material is insulative.

25. The method of claim 24 wherein the oxidation-barrier material is part of the capacitor insulator and forming the capacitor insulator comprises forming the oxidation-barrier material.

26. The method of claim 23 wherein the oxidation-barrier material is conductive and comprises part of the first conductive capacitor electrode.

27. The method of claim 24 wherein the capacitor insulator is formed to comprise oxygen, and further comprising:
exposing the oxidation-barrier material to oxidizing conditions, the oxidizing conditions comprising exposure to oxygen, the oxidation-barrier material during said exposing restricting oxidation of the conductive crystalline metal oxide, and said exposing comprises the formation of the capacitor insulator over the first conductive capacitor electrode, the formation of the capacitor insulator forming the capacitor insulator directly against the oxidation-barrier material.

28. A method of forming a capacitor that comprises a pair of conductive capacitor electrodes having a capacitor insulator there-between, comprising:
forming a first conductive capacitor electrode, comprising:
forming an insulative first material comprising an upwardly-open container shape, the insulative first material consisting of an amorphous insulative metal oxide, the metal of the metal oxide comprising one or more members of the group consisting of Nb, Ta, Ti, V, W and Cr; and
reducing the amorphous insulative metal oxide in a reducing-ambient to form a conductive second material comprising an upwardly-open container shape from the insulative first material, said reducing in the reducing-ambient both:
(a) removing oxygen from and changing the stoichiometry of the metal oxide; and
(b) crystallizing the metal oxide into a crystalline state that is conductive;
forming an oxidation-barrier material comprising an upwardly-open container shape within and directly against the container-shaped first conductive capacitor electrode;
exposing the oxidation-barrier material to oxidizing conditions, the oxidation-barrier material during said exposing restricting oxidation of the conductive crystalline metal oxide;
forming a capacitor insulator directly against the oxidation-barrier material; and
forming a second conductive capacitor electrode directly against the capacitor insulator.

29. The method of claim 28 wherein the oxidation-barrier material precludes any measurable oxidation of the conductive crystalline metal oxide during said exposing.

30. The method of claim 28 wherein,
the oxidizing conditions comprise exposure to oxygen;
the capacitor insulator is formed to comprise oxygen; and
said exposing comprises the formation of the capacitor insulator directly against the oxidation-barrier material.

31. The method of claim 30 wherein the oxidation-barrier material precludes any measurable oxidation of the conductive crystalline metal oxide during said exposing.

* * * * *